United States Patent
Kurose et al.

(10) Patent No.: US 7,521,999 B2
(45) Date of Patent: Apr. 21, 2009

(54) DIFFERENTIAL AMPLIFIER AND SAMPLING AND HOLDING CIRCUIT

(75) Inventors: Daisuke Kurose, Kawasaki (JP); Tetsuro Itakura, Nerima-ku (JP)

(73) Assignee: Kabuhsiki Kaisha Toshiba, Tokyo (JP)

( * ) Notice: Subject to any disclaimer, the term of this patent is extended or adjusted under 35 U.S.C. 154(b) by 26 days.

(21) Appl. No.: 11/687,083

(22) Filed: Mar. 16, 2007

(65) Prior Publication Data

US 2008/0061878 A1    Mar. 13, 2008

(30) Foreign Application Priority Data

Sep. 8, 2006    (JP)    ............... 2006-243869

(51) Int. Cl.
H03F 3/45    (2006.01)
(52) U.S. Cl. .................. 330/258; 330/253; 330/260
(58) Field of Classification Search .............. 330/253, 330/258, 260
See application file for complete search history.

(56) References Cited

U.S. PATENT DOCUMENTS

| | | | |
|---|---|---|---|
| 6,140,877 A * | 10/2000 | Forbes | 330/258 |
| 6,329,849 B1 | 12/2001 | Czarnul et al. | |
| 6,614,301 B2 * | 9/2003 | Casper et al. | 330/253 |
| 6,873,209 B2 * | 3/2005 | Takata et al. | 330/253 |

FOREIGN PATENT DOCUMENTS

| | | |
|---|---|---|
| JP | 2000-148262 | 5/2000 |
| KR | 10-0346989 | 7/2002 |
| TW | 432791 | 11/1998 |

OTHER PUBLICATIONS

Mathew et al, CMOS Vertical Multiple Independent Gate Field Effect Transistor (MIGFET), IEEE International SOI Conference, 2004, pp. 187-189.

Koike et al, XDXMOS: A Novel Technique for the Double-Gate MOSFETs Logic Circuits, IEEE Custom Integrated Circuits Conference, 2004, pp. 247-250.

* cited by examiner

Primary Examiner—Khanh V Nguyen
(74) Attorney, Agent, or Firm—Amin, Turocy & Calvin, LLP

(57) ABSTRACT

Disclosed is a differential amplifier including: first and second transistors each having a first gate, a second gate, a source, and a drain open to a drain side, the first gate and the second gate being controlled independently, a differential input being supplied to between the first gates of the first and second transistors, and the sources of the first and second transistors being connected in common to a first reference potential; first and second load circuits each connected to each of drain sides of the first and second transistors; a detection circuit detecting a common-mode voltage between ones of drain sides of the first and second transistors; and a comparison and amplification circuit amplifying the common-mode voltage in comparison with a second reference potential and supplying an output signal thereof to both of the second gates of the first and second transistors.

8 Claims, 6 Drawing Sheets nMOS TRANSISTOR    nMOS TRANSISTOR    pMOS TRANSISTOR    pMOS TRANSISTOR

DIFFERENTIAL AMPLIFIER AND SAMPLING AND HOLDING CIRCUIT

CROSS REFERENCE TO RELATED APPLICATIONS

This application is based upon and claims the benefit of priority from the prior Japanese Patent Application No. 2006-243869, filed on Sep. 8, 2006; the entire contents of which are incorporated herein by reference.

BACKGROUND OF THE INVENTION

1. Field of the Invention

The present invention relates to a differential amplifier suitable for power saving and a sampling and holding circuit using the same.

2. Description of the Related Art

The description will be given of a differential amplifier including a general MOS transistor having a planar-type structure. Respective gates of two MOS transistors being a differential pair are positive/negative inputs (differential inputs). Drains thereof are differential outputs. The sources of the two MOS transistors are connected with each other and a MOS transistor being a current source through its source and drain is inserted and connected between the sources of the two MOS transistors and a reference potential (ground or power supply voltage). Bias voltage is applied to a gate of the current source transistor, and this voltage suppresses common-mode gain and sets an output operating point to be a predetermined voltage. Further, normally, a MOS transistor (active load) to whose gate a predetermined bias voltage is applied is inserted and connected between the respective drains of the two MOS transistors and a reference potential (power supply voltage or ground) through its source and drain.

In the differential amplifier of the above-described structure in which the paths from source to drain are stacked vertically three times between the power supply voltage and the ground, the current source transistor and the transistors to be active loads as well as the pair of differential transistors are used in a saturation region (a region where a variation in drain current with respect to a variation in voltage between the source and the drain becomes sufficiently small). For this, when the voltage between gate and source is defined as Vgs and a threshold value is defined as Vth, the voltages Vds between the drains and sources of the respective vertically-stacked transistors are set to the voltage of Vgs−Vth or above. When the power supply voltage is defined as Vdd, then a maximum amplitude (peak to peak) Vo that the output signal can exhibit is Vo=Vdd−3 Vds.

Based on the relation: Vo=Vdd−3 Vds, when the power supply voltage downs in accordance with microfabrication of process, it is required that the amplitude of the output signal is reduced to enable all the transistors to operate in the saturation region.

For example, in the transistors having the same process, the case where the power source voltage is 1 V and the case where the power source voltage is 0.8 V are compared. Assuming that Vds is 0.2 V and when the power source voltage is 1 V, 0.2 V is ensured for the respective Vds of a current source transistor, a pair of differential transistors and active load transistors, then the voltage range of the output signal is 0.4 to 0.8V, as an example. Similarly, when the power source voltage is 0.8 V, the voltage range of the output signal is 0.4 to 0.6 V, as an example. In this manner, when the voltage of the power source downs from 1 to 0.8 V, the possible voltage range (namely, amplitude) of the output signal is reduced by half in this case.

When the signal amplitude is small, in order to obtain a desired SNR (signal-to-noise-ratio), it is necessary to reduce a noise level, requiring much more bias current for the transistors as a result thereof. For instance, in the case of the differential amplifier used in a pipeline A/D converter and the like, when the signal amplitude becomes a half, then fourfold current is required to obtain the same SNR. This is because the operation is a sampling system, in which the noise electric power follows kT/C (C: sampling frequency, k=Boltzmann constant, T=temperature).

Even when the power supply voltage reduces by 20%, when fourfold current is required, the consumption power increases. The comparisons are made between the same processes in the above, however, in actual, it is conceivable that the parasitic capacitance reduces and the same performance can be obtained from smaller bias current along with progress in the process. However, when the power supply voltage reduces to around 1 V, the fact that the signal amplitude cannot be obtained sufficiently affects largely, and in the case of an analog circuit such as a differential amplifier, the microfabrication of the process not always leads to the power saving of the circuit.

Note that, in a differential amplifier having MOS transistors and dealing with differential inputs and differential outputs, generally, a circuit to suppress common-mode signals and to set the output operating point of the differential pair to a predetermined level is required. For this purpose, a common-mode feedback circuit is used. An output operating point is generally set at a midpoint of the operating range to obtain a dynamic range as large as possible. The common-mode feedback circuit is composed of a circuit detecting a common-mode voltage of output terminals and an error amplifier comparing and amplifying the detected voltage relatively to a reference voltage (Vref) corresponding to a desired voltage as an output. The output of the error amplifier is connected to the gate of the current source transistor. With this, feedback is applied so that the output midpoint voltage comes equal to Vref.

As an example of the circuit detecting the common-mode voltage in the common-mode feedback circuit as described above, there is one disclosed in JP-A 2000-148262. Since a detection circuit is connected to the output terminals, generally it causes output impedance to lower, so that DC gain is caused to lower. In this disclosed circuit, the same structure as the structure to the output terminals is newly provided for inputs into the detection circuit to prevent the output impedance of the output terminals from lowering.

Subsequently, a structure of a general MOS transistor will be described hereinafter. Currently MOS transistors are largely of a planar type in which a single gate controls a channel. Along with the microfabrication, however, leak current between the drain and the source has been closely looked as a problem. This current is useless current leaking via a silicon substrate even when no voltage is applied to between the gate and the source. As a cause thereof, a phenomenon called punch through, out of short-channel effects, is related thereto.

On the other hand, it is known that the structure controlling the channel by plural gates can bring about an effect of suppressing the punch-through. That having two gates is called Dual-gate FinFET and that having three gates is called Tri-gate MOSFET. Out of the transistors with two gates, that can control the two gates separately is disclosed in "CMOS Vertical Multiple Independent Gate Field Effect Transistor (MIGFET); Mathew, L. et. al.; SOI Conference, 2004. Proceedings. 2004 IEEE International; 4-7 Oct. 2004 Page(s): 187-189". In the disclosure, it is further stated that the second gate can vary the threshold voltage.

BRIEF SUMMARY OF THE INVENTION

A differential amplifier according to one aspect of the present invention includes: first and second transistors each having a first gate, a second gate, a source, and a drain open to a drain side, the first gate and the second gate being controlled independently, a differential input being supplied to between the first gate of the first transistor and the first gate of the second transistor, and the source of the first transistor and the source of the second transistor being connected in common to a first reference potential; first and second load circuits each connected to each of the drain side of the first transistor and the drain side of the second transistor; a detection circuit configured to detect a common-mode voltage between the drain side of the first transistor and the drain side of the second transistor; and a comparison and amplification circuit configured to amplify the common-mode voltage in comparison with a second reference potential and to supply an output signal thereof to both of the second gate of the first transistor and the second gate of the second transistor.

A sampling and holding circuit according to another aspect of the present invention includes: a differential amplifier including; first and second transistors each having a first gate, a second gate, a source, and a drain open to a drain side, the first gate and the second gate being controlled independently, the source of the first transistor and the source of the second transistor being connected in common to a first reference potential; first and second load circuits each connected to each of the drain side of the first transistor and the drain side of the second transistor; a detection circuit configured to detect a common-mode voltage between the drain side of the first transistor and the drain side of the second transistor; and a comparison and amplification circuit configured to amplify the common-mode voltage in comparison with a second reference potential and to supply an output signal thereof to both of the second gate of the first transistor and the second gate of the second transistor; first and second capacitors each connected to each of the first gate of the first transistor and the first gate of the second transistor; first and second switching circuits each configured to input a charge into each of the first and second sampling capacitors; and third and fourth switching circuits each connected to the differential amplifier and configured to make each of voltages generated in the first and second sampling capacitors by the charge be outputted in a output of the differential amplifier.

DETAILED DESCRIPTION OF THE INVENTION

Explanation of Embodiments

Figure 1A:
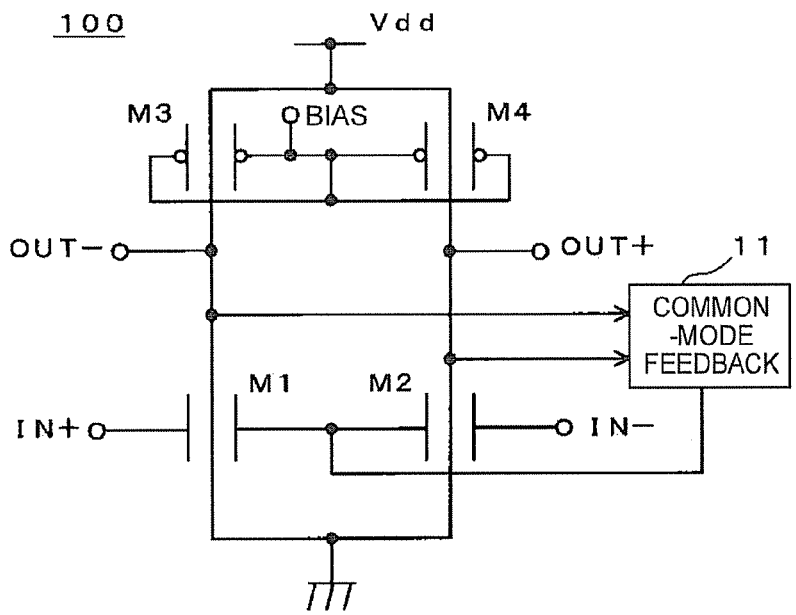
FIGS. 1A, 1B, 1C, 1D, 1E, 1F each is a circuit diagram showing a configuration of a differential amplifier according to an embodiment, or a circuit diagram or a schematic diagram schematically showing a configuration of a transistor used therein.

Although embodiments of the present invention will be described with reference to the drawings, these drawings are presented for the purpose only of illustration and in no case limit the invention.

In a differential amplifier being a mode, transistors each having two gates are used for the transistors accepting a differential input. Sources of these transistors are connected in common to a reference potential. Further, common-mode voltage is detected between the drain sides of these transistors, the detected common-mode voltage is compared and amplified relatively to a reference voltage, and the output signal is supplied in common to both of another gates of the transistors accepting the differential input. This is a common-mode feedback. Independently from the other gate for the common-mode feedback, one gate can be controlled, and this one gate is used for the differential input. According to the configuration as described above, a current source transistor to flow bias current into the transistors to which the differential input is supplied becomes unnecessary. Accordingly, the power supply voltage can be reduced to the extent thereof. Hence, the power saving can be realized without degrading other performance such as SNR instead.

A sampling and holding circuit being another mode uses the above-described one as a differential amplifier, and further includes a sampling capacitor and a switching circuit. Accordingly, with the power-supply-voltage lowering effect in the differential amplifier, the power saving can be realized without degrading other performance such as SNR instead.

As a form of the above-described aspect, it is acceptable that each of the first and second load circuits includes a transistor having a source, a drain, and two gates, in which both of the two gates of the transistor are connected in common to a third reference potential, the drains of the transistors are connected to a drain side of each of the first and second transistors, respectively, and both of the sources of the transistors are connected in common to a fourth reference potential. The load circuits are composed of the transistor with two gates that is the same kind as the transistor accepting the differential input. It is suited for the case where the circuit is composed of nMOS and pMOS each having a mutually symmetrical structure.

Further, as a form, it is possible to further include third and fourth transistors each inserted and connected between a drain side of each of the first and second transistors and each of the first and second load circuits, so that sources thereof are on a side of the first or second transistor and drains thereof are on a side of the first or second load circuit, and fifth and sixth transistors each inserted and connected between a drain side of each of the third and fourth transistors and each of the first and second load circuits, so that sources thereof are on a side of the first or second load circuit and drains thereof are on a side of the third or fourth transistor. This circuit has a cascode structure in its output. According to the cascode structure, the output impedance can be increased, in which higher gain can be realized as a differential amplifier.

Here, it is also acceptable that each of the third and fourth transistors has two gates, and both of the two gates are connected in common to a third reference potential and that each of the fifth and sixth transistors has two gates, and both of the two gates are connected in common to a fourth reference potential. This is to use the transistor with two gates also for the transistor to make the output have the cascode structure. This is suited for the case where the circuit is composed of nMOS and PMOS each having a mutually symmetrical structure.

Also, here, it is possible to further include four amplifying circuits each having an input terminal and an output terminal, in which a polarity from the input terminal to the output terminal exhibits a reversed polarity, the input terminals are connected to the sources of the third, fourth, fifth, and sixth transistors, respectively, and the output terminals are connected to the gates of the corresponding third, fourth, fifth, and sixth transistors, respectively. This circuit has an active cascode structure in its output. With the active cascode structure, the output impedance can be increased further, in which higher gain can be realized as a differential amplifier.

Also, here, it is acceptable that each of the third, fourth, fifth, and sixth transistors has two gates, and that included are four amplifying circuits each having an input terminal and an output terminal, in which a polarity from the input terminal to the output terminal exhibits a reversed polarity, the input terminals are connected to the sources of the third, fourth, fifth, and sixth transistors, respectively, and the output terminals are connected to both of the two gates of the corresponding third, fourth, fifth, and sixth transistors, respectively. 1) This uses the transistor with two gates also for the transistor to make the output have the cascode structure. This is suited for the case where the circuit is composed of nMOS and pMOS each having a mutually symmetrical structure. Furthermore, 2) this is to make the output have an active cascode structure. With the active cascode structure, the output impedance can be increased further, in which higher gain can be realized as a differential amplifier.

Also, here, it is possible to further include third and fourth load circuits each connected to the each of the drain sides of the first and second transistors; seventh and eighth transistors each inserted and connected between the drain side of the each of the first and second transistors and each of the third and fourth load circuits, so that sources thereof are on the side of the first or second transistor and drains thereof are on a side of the third or fourth load circuit; and ninth and tenth transistors each inserted and connected between a drain side of each of the seventh and eighth transistors and each of the third and fourth load circuits, so that sources thereof are on a side of the third or fourth load circuit and drains thereof are on a side of the seventh or eighth transistor, wherein the detection circuit includes a conductor connecting in common between ones of drain sides of the third and fourth transistors and between ones of drain sides of the fifth and sixth transistors, and a node voltage of the conductor is the common-mode voltage.

This structure provides another pair of output cascode structures and load circuits in addition to the output cascode structures provided to perform the common-mode feedback. According to the above-described structure, it is possible to make the other pair of output cascode structures serve to avoid the effect of the circuit for the common-mode feedback, so that the output impedance down caused by the circuit for the common-mode feedback can be prevented.

Also, here, it is possible to further include seventh and eighth transistors each inserted and connected between the drain side of the each of the first and second transistors and each of the first and second load circuits, so that sources thereof are on the side of the first or second transistor and drains thereof are on a side of the first or second load circuit; and ninth and tenth transistors each inserted and connected between a drain side of each of the seventh and eighth transistors and each of the first and second load circuits, so that sources thereof are on a side of the first or second load circuit and drains thereof are on a side of the seventh or eighth transistor, wherein the detection circuit includes a conductor connecting in common between ones of drain sides of the third and fourth transistors and between ones of drain sides of the fifth and sixth transistors, and a node voltage of the conductor is the common-mode voltage.

This structure also provides another pair of output cascode structures in addition to the output cascode structures provided to perform the common-mode feedback, while the load circuits are used in common between the other pair of output cascode structures and the output cascode structures for the common-mode feedback. Also with the above-described structure, it is possible to make the other pair of output cascode structures serve to avoid the effect of the circuit for the common-mode feedback, so that the output impedance down caused by the circuit for the common-mode feedback can be prevented.

Further, as a form, it is also possible that the detection circuit includes two resistors connected in series between ones of drain sides of the first and second transistors and a voltage at a midpoint of the two resistors is the common-mode voltage. This is a simple structure to detect the common-mode voltage.

Based on the above, hereinafter, the embodiments will be described with reference to the drawings. FIGS. 1A, 1B, 1C, 1D, 1E, 1F show a configuration of a differential amplifier according to an embodiment (FIG. 1A and FIGS. 1B to 1E) and a schematic structure (FIG. 1F) of a transistor used therein. As shown in FIG. 1A, a differential amplifier 100 includes dual gate n-channel MOS transistors M1, M2, dual gate p-channel MOS transistors M3, M4 and a common-mode feedback circuit 11 (hereinafter, the "n-channel MOS" is also referred to as "nMOS" and the "p-channel MOS" is also referred to as PMOS).

Figures 1B, 1C, 1D, 1E:
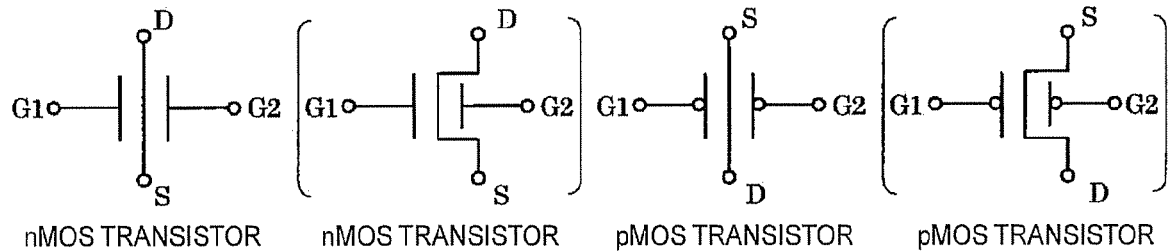
Figure 1F:
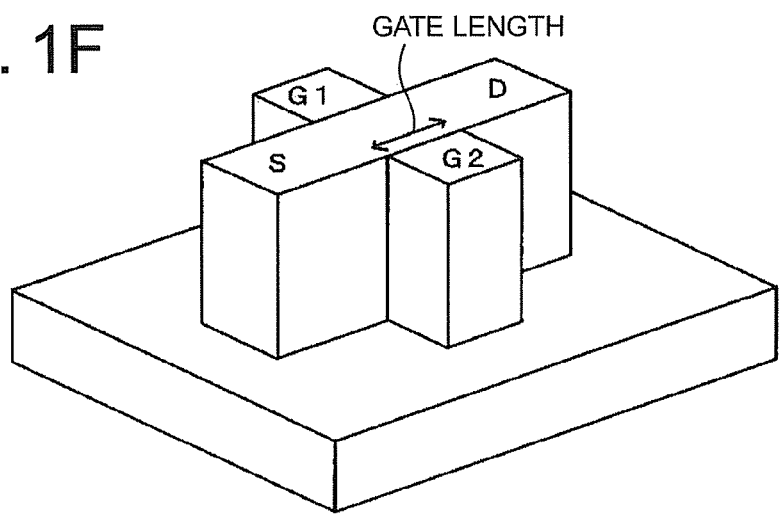

The dual gate n-channel MOS transistors M1, M2 in FIG. 1A are represented by a circuit diagram shown in FIG. 1B. There may be a case where the circuit diagram shown in FIG. 1C is used to represent a transistor having the same meaning as the transistor shown in FIG. 1B. Further, similarly, the dual gate p-channel MOS transistors M3, M4 in FIG. 1A are represented by the circuit diagram shown in FIG. 1D, however, the circuit diagram shown in FIG. 1E is sometimes used to represent a transistor having the same meaning as the transistor shown in FIG. 1D. As for the representation of the transistor with dual gate, the same is also applicable to the respective embodiments described below.

As shown in the drawings, the dual gate n-channel MOS transistors M1, M2 and the dual gate p-channel MOS transistors M3, M4 include two electrodes G1, G2, as gates, respectively. These can be controlled independently from outside. These have a schematic structure as shown for example in FIG. 1F. That is, differently from a transistor of a planar type, a source region, a drain region, a first gate region, and a second gate region are formed in a columnar shape on a substrate with a channel region provided between the source region and the drain region. It is structured that the channel region is controlled by the gate G1 and the gate G2.

The dual gate n-channel MOS transistors M1, M2 serve as input elements as a differential amplifier as shown in FIG. 1A, and one of the gates of each of the transistors M1, M2 is a differential input terminal (IN+, IN−). The sources are connected in common to the reference potential (in this case, GND). The drains are connected to drains of the dual gate p-channel MOS transistors M3, M4 being active loads, respectively, and the connecting nodes are the output terminals (OUT+, OUT−) as a differential amplifier.

The dual gate p-channel MOS transistors M3, M4 are transistors being loads of the dual gate n-channel MOS transistors M1, M2, respectively, as described above, and sources thereof are connected in common to the reference potential (in this case, power supply voltage Vdd). Both the gates in each of the transistors M3, M4 are connected to a predetermined reference potential (bias potential).

A common-mode feedback circuit 11 detects a common-mode voltage between the drains of the dual gate n-channel MOS transistors M1, M2, and compares and amplifies the detected common-mode voltage relatively to a reference potential and an output signal thereof is supplied in common to terminals of the gates other than the input terminals of the dual gate n-channel MOS transistors M1, M2. This will be further detailed later. With the function as described above, the drain voltages of the dual gate n-channel MOS transistors M1, M2 can be set at the above-described reference potential on the average Further, an output of a common mode signal can be prevented.

Figure 2:
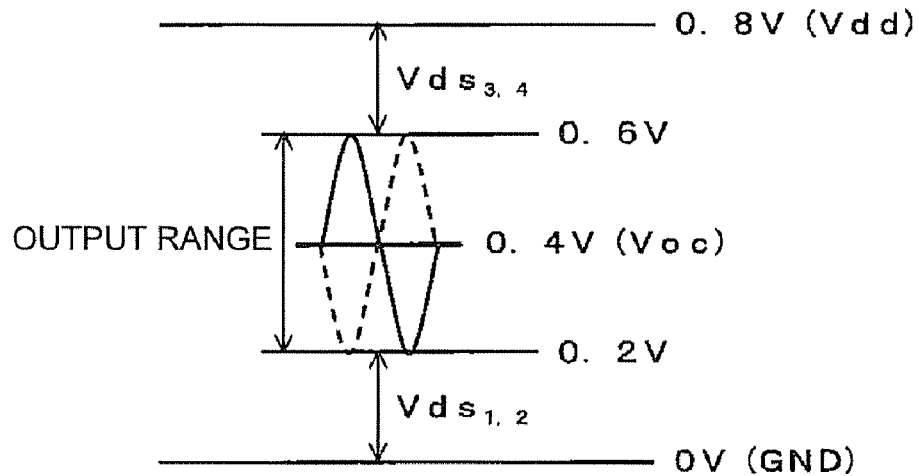
FIG. 2 is an explanatory diagram of a range of output voltage in the differential amplifier shown in FIG. 1.

FIG. 2 shows a range of output voltage in the differential amplifier shown in FIG. 1. As shown in FIG. 2, assuming that the power supply voltage Vdd=0.8 V, the voltage Vds between drain and source is 0.2 V at the dual gate n-channel MOS transistors M1, M2 and at the dual gate p-channel MOS transistors M3, M4, respectively, then the respective drain voltages of the transistors M1, M2 are variable in the range of 0.2 to 0.6 V. Namely, assuming that the reference potential in the common-mode feedback circuit 11 is 0.4 V, a signal output of 0.4 V (peak to peak) at maximum can be realized around output average voltage Voc=0.4 V.

This is an output range obtained since there is no transistor connected to be a current source to the sources of the transistors M1, M2. When the current source transistor exists, another 0.2 V will be required thereby, in which the output signal range reduces by half to 0.2 V (peak to peak) at maximum, so that the SNR downs as well. An increase in the bias current of the respective transistors to ensure the SNR goes back this time in view of the power saving.

As described above, according to the differential amplifier of the present embodiment, the power saving can be realized without degrading the other performance such as SNR instead. Accordingly, this is useful particularly in an application for a circuit requiring a power supply voltage of, for example, below 1V.

Figure 3:
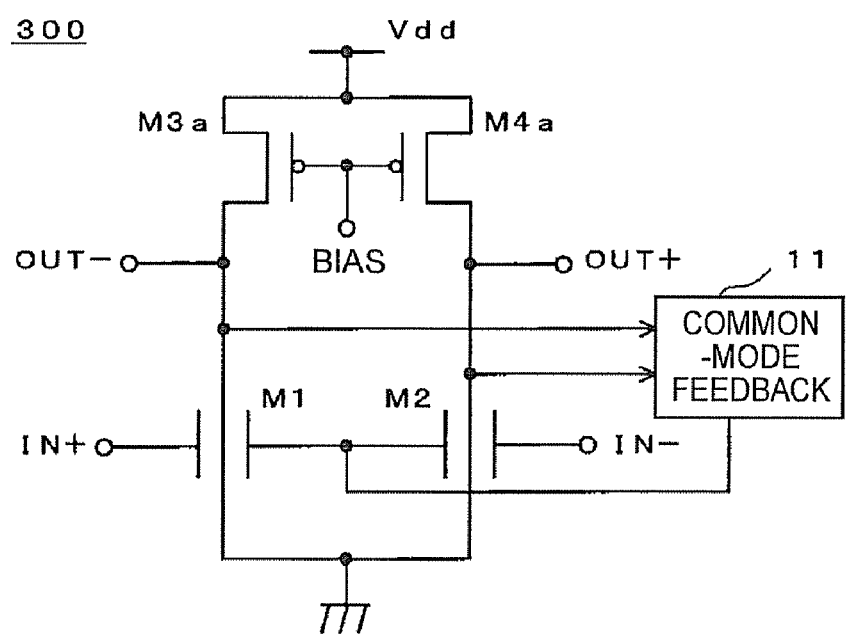
FIG. 3 is a circuit diagram showing a configuration of a differential amplifier according to another embodiment.

Subsequently, the description will be given of another embodiment with reference to FIG. 3. FIG. 3 shows a configuration of a differential amplifier according to another embodiment. In FIG. 3, the same or those corresponding to the same as in FIG. 1A are denoted by the same numerical references and the description thereof will be omitted here.

In a differential amplifier 300, for the transistor being an active load, normal p-channel MOS transistors M3a, M4a each having a single gate is used in place of the dual gate transistors. The point that the reference potential (bias potential) is applied to these gates is the same as in the embodiment shown in FIG. 1A. Further, the other points are the same as well as the embodiment shown in FIG. 1A. Also, in this embodiment, the same effect as in the above-described embodiment can be obtained. Further, for the p-channel MOS transistors M3a, M4a, those having anormal planar-type structure can be used, so that the process may be realized at lower cost.

Figure 4:
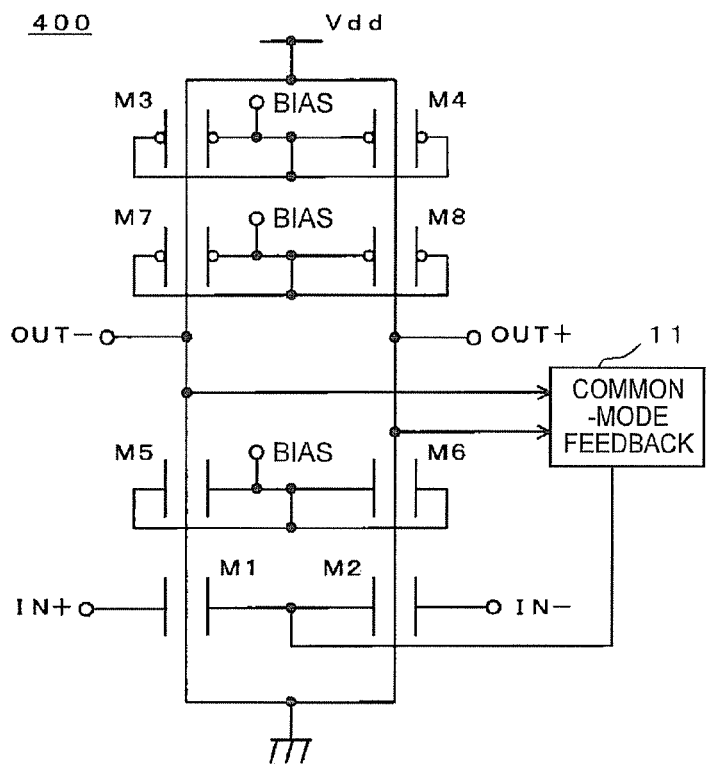
FIG. 4 is a circuit diagram showing a configuration of a differential amplifier according to still another embodiment.

Subsequently, the description will be given of still another embodiment with reference to FIG. 4. FIG. 4 shows a configuration of a differential amplifier according to still another embodiment. In FIG. 4, the same or those corresponding to the same as in the drawings already described are denoted by the same numerical references and the description thereof will be omitted here.

In the differential amplifier 400, an n-channel MOS transistors M5, M6 are inserted and connected in a cascode manner (i.e. through their sources and drains) between the nodes to be the output terminals (OUT+, OUT−) and the drains of the transistors M1, M2 accepting the differential input. Further, a p-channel MOS transistors M7, M8 are inserted and connected in a cascode manner (i.e. through their sources and drains) between the nodes to be the output terminals (OUT+, OUT−) and the drains of the transistors M3, M4 being the active load elements. These transistors M5, M6, M7, M8 also include two gates, respectively, and the same bias voltage is applied to those two gates.

According to the configuration having the cascode circuit as described above, the output impedance can be increased as the differential amplifier 400, so that the DC gain can be increased to the extent thereof. It is possible to obtain higher gain with ease by a simple configuration.

Figure 5:
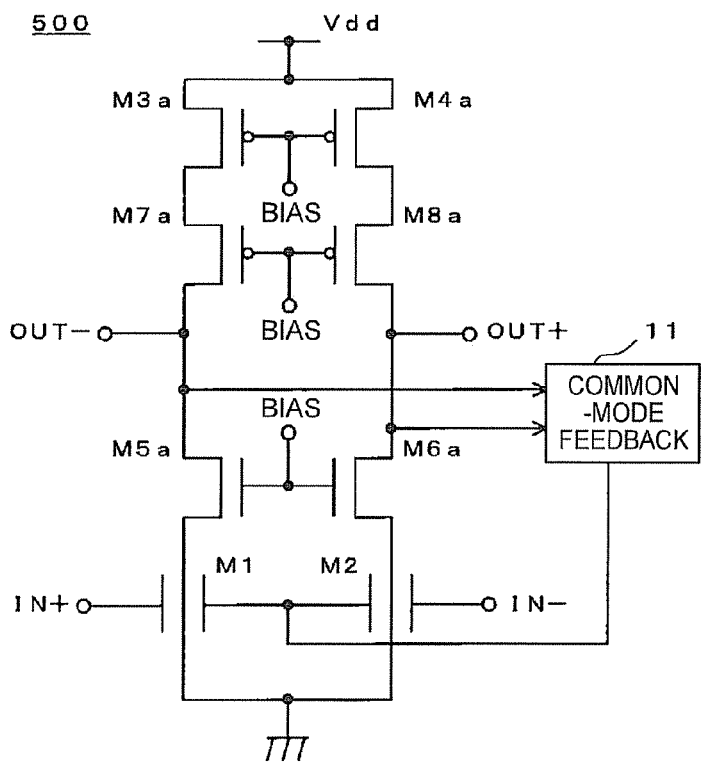
FIG. 5 is a circuit diagram showing a configuration of a differential amplifier according to yet another embodiment.

Subsequently, the description will be given of yet another embodiment with reference to FIG. 5. FIG. 5 shows a configuration of a differential amplifier according to yet another embodiment. In FIG. 5, the same or those corresponding to the same as in the drawings already described are denoted by the same numerical references and the description thereof will be omitted here.

In the differential amplifier 500, for the transistors to be active loads, normal p-channel MOS transistors M3a, M4a each having a single gate are used in place of the dual-gate transistors, and further, for the transistors of a cascode circuit described in FIG. 4, normal n-channel MOS transistors M5a, M6a and normal p-channel MOS transistors M7a, M8a each having a single gate are used. The point that the reference potential (bias potential) is applied to the respective gates of the transistors M3a, M4a, M5a, M6a, M7a, M8a is the same as of the embodiment shown in FIG. 4. Also, the other points are the same as of the embodiment shown in FIG. 4.

Also, in this embodiment, the same effect as of the embodiment shown in FIG. 4 can be obtained. Further, for the p-channel MOS transistors M3a, M4a, M7a, M8a, those having a normal planar-type structure can be used, so that the process may be realized at lower cost.

Figure 6:
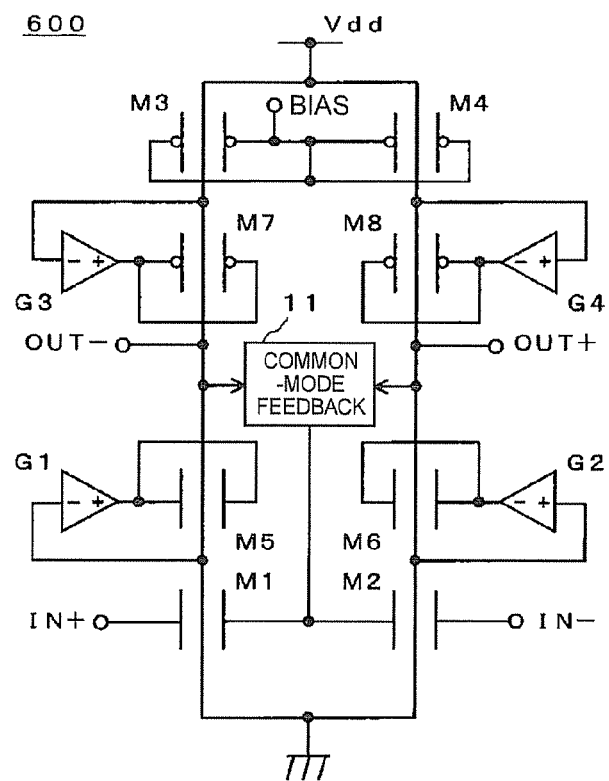
FIG. 6 is a circuit diagram showing a configuration of a differential amplifier according to yet another embodiment.

Subsequently, the description will be given of yet another embodiment with reference to FIG. 6. FIG. 6 shows a configuration of a differential amplifier according to yet another embodiment. In FIG. 6, the same or those corresponding to the same as in the drawings already described are denoted by the same numerical references and the description thereof will be omitted here.

The differential amplifier 600 is an amplifier in which the cascode circuits in FIG. 4 are improved to so-called active cascode circuits. More specifically, amplifying circuits G1, G2, G3, G4 whose polarities from input to output are reversed, are newly provided so that they are connected to the sources of the transistors M5, M6, M7, M8 on input terminal sides thereof and connected to the gates on output terminal sides thereof. There are no terminals to apply biases at the gates of the transistors M5, M6, M7, M8.

According to the configuration as described above, the gain as a differential amplifier becomes large to the extent of the gain of the amplifying circuits G1 to G4 in addition to the gain increased by the cascode circuits. It is possible to obtain still higher gain with ease by a simple configuration.

Figure 7:
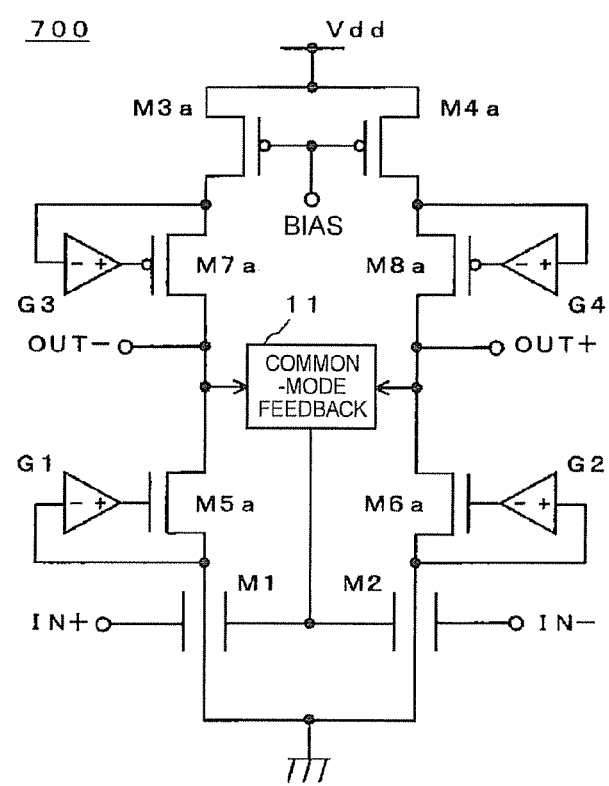
FIG. 7 is a circuit diagram showing a configuration of a differential amplifier according to yet another embodiment.

Subsequently, the description will be given of yet another embodiment with reference to FIG. 7. FIG. 7 shows a configuration of a differential amplifier according to yet another embodiment. In FIG. 7, the same or those corresponding to the same as in the drawings already described are denoted by the same numerical references and the description thereof will be omitted here.

The differential amplifier 700 is an amplifier in which the cascode circuits in FIG. 5 are improved to so-called active cascode circuits. More specifically, amplifying circuits G1, G2, G3, G4 whose polarities from input to output are reversed, are newly provided so that they are connected to the sources of the transistors M5a, M6a, M7a, M8a on input terminal sides thereof and connected to the gates on output terminal sides thereof. There are no terminals to apply biases at the gates of the transistors M5a, M6a, M7a, M8a.

Also with the configuration as described above, the gain as a differential amplifier becomes large to the extent of the gain of the amplifying circuits G1 to G4 in addition to the gain increased by the cascode circuits. It is possible to obtain still higher gain with ease by a simple configuration. Further, for the p-channel MOS transistors M3a, M4a, M7a, M8a, those having a normal planar-type structure can be used, so that the process may be realized at lower cost.

Figure 8:
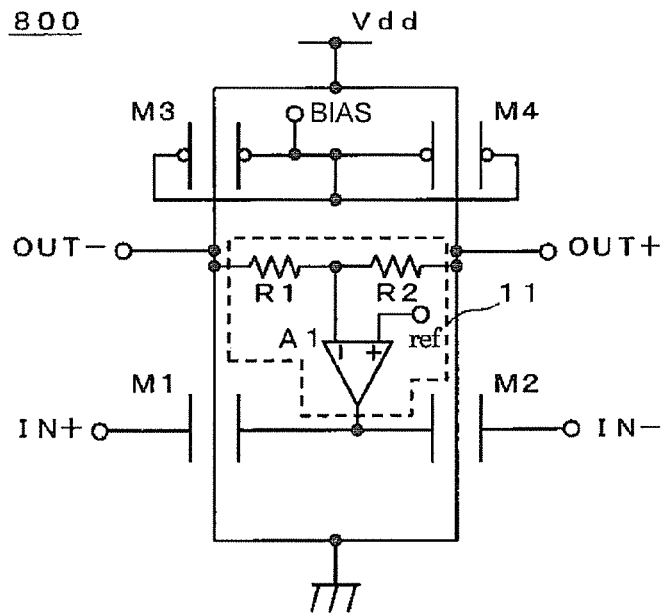
FIG. 8 is a circuit diagram including a concrete example of a common-mode feedback circuit in the differential amplifier shown in FIG. 1.

FIG. 8 shows a differential amplifier including a concrete example of the common-mode feedback circuit in the differential amplifier shown in FIG. 1. In FIG. 8, the same or those corresponding to the same as in the drawings already described are denoted by the same numerical references and the description thereof will be omitted here.

As has been described, the common-mode feedback circuit 11 has functions of detecting the common-mode voltage between the drains of the transistors M1, M2, comparing and amplifying the detected common-mode voltage relatively to a reference potential, and supplying an output signal thereof in common to terminals of the gates other than the input terminals of the transistors M1, M2. In the embodiment shown in FIG. 8, for the detection of the common-mode voltage, a circuit composed of two resistors R1, R2 connected in series between the drains of the transistors M1, M2 is used. Specifically, the voltage at the midpoint of these two resistors is the common-mode voltage.

The common-mode voltage is lead to an inverting input of the amplifying circuit A1, and compared and amplified relatively to a reference potential (ref) supplied to a noninverting input of the amplifying circuit A1. With the feedback as described above, the common-mode voltage appears to match the reference potential (ref), and therefore, an average output potential as a differential amplifier 800 is set to match the reference potential (ref).

Although the concrete example of the common-mode feedback circuit 11 as described above has a simple configuration as a circuit, the resistors R1, R2 to detect the common-mode voltage causes the output impedance to lower. Accordingly, depending on the application, the case where the required gain as a differential amplifier is not achieved can be considered, however, when the gain is not required so much, this is enough useful.

Figure 9:
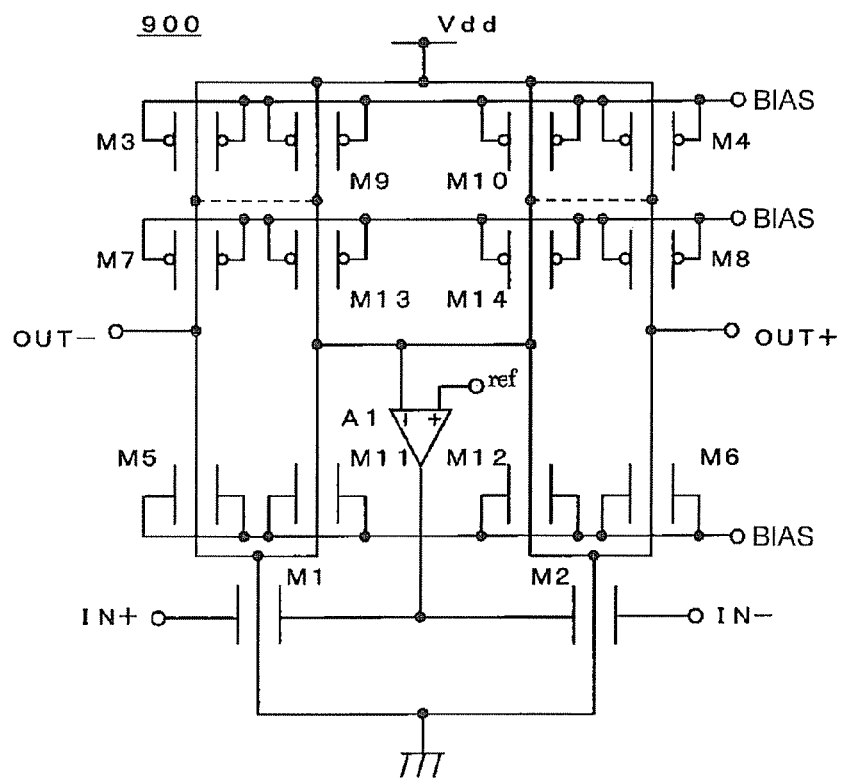
FIG. 9 is a circuit diagram showing a configuration of a differential amplifier according to yet another embodiment.

Subsequently, the description will be given of yet another embodiment with reference to FIG. 9. FIG. 9 shows a configuration of a differential amplifier according to yet another embodiment. In FIG. 9, the same or those corresponding to the same as in the drawings already described are denoted by the same numerical references and the description thereof will be omitted here.

A differential amplifier 900 has a configuration to prevent the output impedance down by the common-mode feedback circuit. Based on the same configuration as of the differential amplifier 400 shown in FIG. 4, transistors M1, M13, M9 each having the same configuration as of the transistors M5, M7, M3 respectively are newly provided for the common-mode feedback, and further transistors M12, M14, M10 each having the same configuration as of the transistors M6, M8, M4 respectively are newly provided for the same. In the common-mode feedback, the common-mode voltage is detected from the connecting node of the newly provided transistors M11, M13 and the connecting node of the transistors M12, M14. These connecting nodes are different from the nodes with the output terminals and do not affect the output impedance, allowing direct connection without resistors therebetween. The direct connecting node is lead to the inverting input of the amplifying circuit A1.

With the configuration as described above, voltage of the connecting node of the transistors M11, M13 and voltage of the connecting node of the transistors M12, M14 appear to match the reference potential (ref). With this, as for the connecting node of the transistors M5, M7 having the same configuration as of these transistors M11, M13 and the connecting node of the transistors M6, M8 having the same configuration as of these transistors M12, M14, the average output potential thereof therefore agrees with the reference potential (ref).

As a modification example of this embodiment, it is acceptable that the drains of the transistors M3, M9 are also connected and the drains of the transistors M4, M10 are also connected (shown by broken lines in the drawing). Even when they are connected, no current flows. With further progress, the transistors M3 and M9 may be a single same transistor, and the transistors M4 and M10 may be a single same transistor. Further, the concept of the embodiments shown in FIGS. 5, 6, 7 applicable to the embodiment shown in FIG. 4 is also applicable to the embodiment shown in FIG. 9. That is, it is possible to replace the transistor with the normal transistor having a single gate or to activate the cascode circuit.

Figure 10:
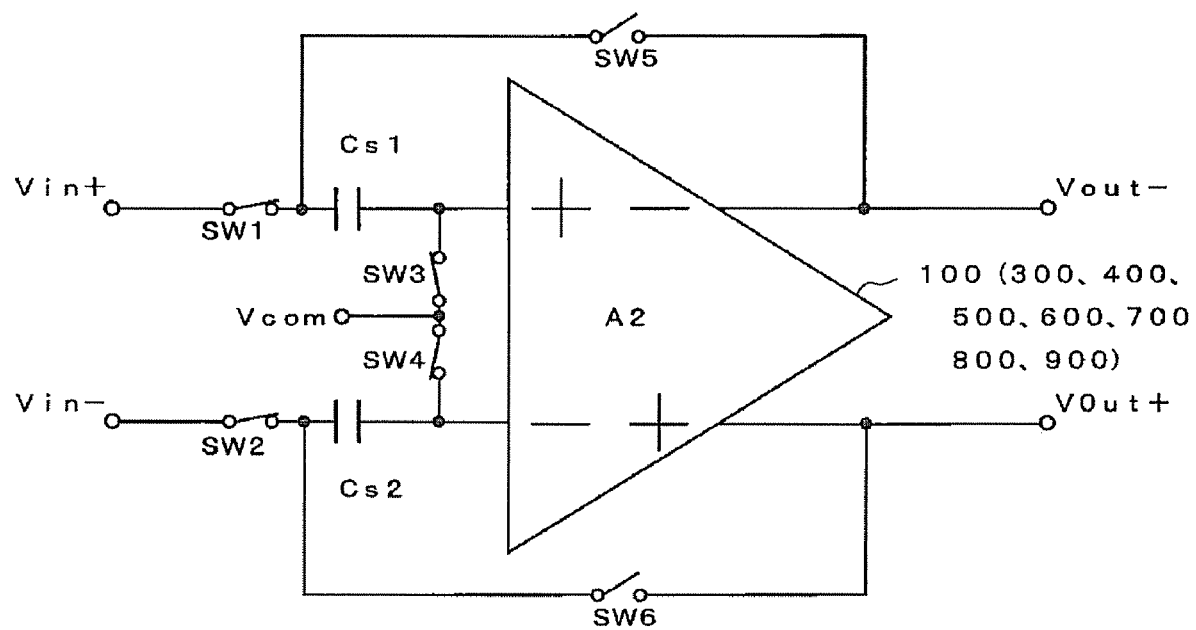
FIG. 10 is a circuit diagram showing a configuration of a sampling and holding circuit according to an embodiment.

Subsequently, FIG. 10 shows a configuration of a sampling and holding circuit according to an embodiment. For a differential amplifier A2 shown in the drawing, any of the above-descried respective differential amplifiers 100, 300, 400, 500, 700, 800, 900 can be used.

As a configuration, a positive input Vin+ is connected to a positive input of the differential amplifier A2 and a switching circuit SW3 via a switching circuit SW1 and a sampling capacitor Cs1. Further, a negative input Vin− is connected to a negative input of the differential amplifier A2 and a switching circuit SW4 via a switching circuit SW2 and a sampling capacitor Cs2. The other ends of SW3 and SW4 are connected to a common potential Vcom. Further, a switching circuit SW5 is connected between a connecting node of SW1 and Cs1 and the negative output of the differential amplifier A2, and a switching circuit SW6 is connected between a connecting node of SW2 and Cs2 and the positive output of the differential amplifier A2. For the switching circuits SW1 to SW6, a switching circuit using a MOS transistor is available.

As for an operation, at switching positions of the switching circuits SW1 to SW6 in the drawing, the voltage lead to Vin+ is charged in the sampling capacitor Cs1, and further the voltage lead to Vin− is charged in the sampling capacitor Cs2 (sampling). Subsequently, when the switching positions of the switching circuits SW1 to SW6 in the drawing are switched opposite to that shown in the drawing, voltages the sampling capacitors Cs1, Cs2 generate by being charged is generated at the output terminals Vout+, Vout− of the differential amplifier A2 to be held (holding).

According to the sampling and holding circuit as described above, the advantage of the differential amplifier A2 is made use of and the power saving can be realized without degrading other performance such as SNR instead.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A differential amplifier, comprising:
   first and second transistors each having a first gate, a second gate, a source, and a drain open to a drain side, the first gate and the second gate being controlled independently, a differential input being supplied to between the first gate of the first transistor and the first gate of the second transistor, and the source of the first transistor and the source of the second transistor being connected in common to a first reference potential;
   first and second load circuits each connected to each of the drain side of the first transistor and the drain side of the second transistor;
   a detection circuit configured to detect a common-mode voltage between the drain side of the first transistor and the drain side of the second transistor;
   a comparison and amplification circuit configured to amplify the common-mode voltage in comparison with a second reference potential and to supply an output signal thereof to both of the second gate of the first transistor and the second gate of the second transistor;
   third and fourth transistors each inserted and connected between the drain of each of the first and second transistors and each of the first and second load circuits, so that sources thereof are on a side of the first or second transistor and drains thereof are on a side of the first or second load circuits; and
   fifth and sixth transistors each inserted and connected between each of the drains of the third and fourth transistors and each of the first and second load circuits, so that sources thereof are on a side of the first or second load circuit and drains thereof are on a side of the third or fourth transistor.

2. The differential amplifier according to claim 1,
   wherein each of the first and second load circuits includes a transistor having a source, a drain, and two gates, both of the two gates are connected in common to a third reference potential, the drain of the transistor of the first load circuit and the drain of the transistor of the second load circuit are connected to the drain side of each of the first and second transistors, respectively, and both of the source of the transistor of the first load circuit and the source of the transistor of the second load circuit are connected in common to a fourth reference potential.

3. The differential amplifier according to claim 1,
   wherein each of the third and fourth transistors has two gates connected in common to a third reference potential; and
   wherein each of the fifth and sixth transistors has two gates connected in common to a fourth reference potential.

4. The differential amplifier according to claim 1, further comprising:
   four amplifying circuits each having an input terminal and an output terminal, in which a polarity from the input terminal to the output terminal exhibits a reversed polarity, the input terminal is connected to any different one of the sources of the third, fourth, fifth, and sixth transistors, and the output terminal is connected to one of gates of the third, fourth, fifth, and sixth transistors corresponding.

5. The differential amplifier according to claim 1,
   wherein each of the third, fourth, fifth, and sixth transistors has two gates; and
   further comprising four amplifying circuits each having an input terminal and an output terminal, in which a polarity from the input terminal to the output terminal exhibits a reversed polarity, the input terminal is connected to any different one of the sources of the third, fourth, fifth, and sixth transistors, and the output terminal is connected to both of the two gates of one of the third, fourth, fifth, and sixth transistors corresponding.

6. The differential amplifier according to claim 1, further comprising:
   third and fourth load circuits each connected to the each of the drain side of the first transistor and the drain side of the second transistor;
   seventh and eighth transistors each inserted and connected between the drain of the each of the first and second transistors and each of the third and fourth load circuits, so that sources thereof are on the side of the first or second transistor and drains thereof are on a side of the third or fourth load circuit; and
   ninth and tenth transistors each inserted and connected between each of the drains of the seventh and eights transistors and the each of the third and fourth load circuits, so that sources thereof are on a side of the third or fourth load circuit and drains thereof are on a side of the seventh or eighth transistor,
   wherein the detection circuit includes a conductor connecting in common between ones of the drains of the third and fourth transistors and between ones of the drains of the fifth and sixth transistors, and a node voltage of the conductor is the common-mode voltage.

7. The differential amplifier according to claim 1, further comprising:
   seventh and eighth transistors each inserted and connected between the drain of the each of the first and second transistors and each of the first and second load circuits, so that sources thereof are on the side of the first or second transistor and drains thereof are on a side of the first or second load circuit; and
   ninth and tenth transistors each inserted and connected between each of the drains of the seventh and eighth transistors and the each of the first and second load circuits, so that sources thereof are on a side of the first or second load circuit and drains thereof are on a side of the seventh or eighth transistor,
   wherein the detection circuit includes a conductor connecting in common between ones of the drains of the third and fourth transistors and between ones of the drains of the fifth and sixth transistors, and a node voltage of the conductor is the common-mode voltage.

8. The differential amplifier according claim 1,
   wherein the detection circuit includes two resistors connected in series between the drain side of the first transistor and the drain side of the second transistor and a voltage at a midpoint of the two resistors is the common-mode voltage.

* * * * *